United States Patent
Borden et al.

(10) Patent No.: US 7,215,590 B1
(45) Date of Patent: May 8, 2007

(54) SEMICONDUCTOR DIE WITH PROCESS VARIATION COMPENSATED OPERATING VOLTAGE

(75) Inventors: Craig E. Borden, Placentia, CA (US); Chih-Shun Ding, Austin, TX (US); Steve Majors, Austin, TX (US); Mishel Matloubian, Irvine, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 20 days.

(21) Appl. No.: 11/187,431

(22) Filed: Jul. 21, 2005

(51) Int. Cl.
 *G11C 5/14* (2006.01)
(52) U.S. Cl. .................. 365/226; 365/225.7; 327/538; 324/765
(58) Field of Classification Search ............ 365/226 O, 365/201, 225.7 X, 226; 327/538 X, 538; 324/765 X, 765; 714/718
See application file for complete search history.

(56) References Cited

U.S. PATENT DOCUMENTS 6,211,727 B1* 4/2001 Carobolante ................ 327/543
6,897,674 B2* 5/2005 Braceras et al. ............ 324/765
7,060,566 B2* 6/2006 Vogelsang .................. 438/270
2005/0162181 A1* 7/2005 Braceras et al. ............ 324/765

* cited by examiner

Primary Examiner—VanThu Nguyen
(74) Attorney, Agent, or Firm—Farjami & Farjami LLP

(57) ABSTRACT

A semiconductor die includes at least one process monitoring circuit for evaluating at least one process parameter of the semiconductor die. The at least one process monitoring circuit can include a first group of process monitoring circuits for monitoring NFET speed and a second group of process monitoring circuits for monitoring PFET speed. The process monitoring circuits can be distributed at the corners of the semiconductor die. The semiconductor die further includes a voltage control circuit configured to store optimum voltage information corresponding to the at least one process parameter. The voltage control circuit is further configured to selectively provide the optimum voltage information to a system power supply. The voltage control circuit includes a calculated optimum voltage register that stores the optimum voltage information corresponding to the at least one process parameter.

22 Claims, 2 Drawing Sheets

SEMICONDUCTOR DIE WITH PROCESS VARIATION COMPENSATED OPERATING VOLTAGE

BACKGROUND OF THE INVENTION

1. Field of the Invention

The present invention is generally in the field of semiconductors and circuits. More particularly, the invention is in the field of voltage control circuits on semiconductor dies.

2. Background Art

In semiconductor fabrication technology, process parameters can vary significantly from lot to lot, from wafer to wafer in the same lot, and even across the same wafer. For example, process parameters can vary by over 15.0 percent from lot to lot or even from wafer to wafer in the same lot. The process variations can even cause semiconductor dies to operate out of specification, which can significantly affect semiconductor die power, performance, and yield. For example, process variations can affect semiconductor die performance by causing a semiconductor die to have a speed that is either too high or too low. As another example, process variations can also reduce semiconductor die yield, since semiconductor dice that are out of specification may have to be discarded. Thus, semiconductor die manufacturers are challenged to provide a solution to process variations.

One approach currently utilized for dealing with process variations across the wafer consists of "speed binning" semiconductor dies. In "speed binning," the semiconductor dies are tested and sorted based on their operating speed at a specified fixed voltage. This approach works well for mass produced semiconductor dies, such as computer microprocessors, where a market exist for different speed devices. However, this approach does not work as well for many other semiconductor market segments, such as networking semiconductor dice, where volume isn't as high and only a single speed device can be sold.

In another approach, the operating voltage of the semiconductor die is adjusted in an attempt to compensate for process variations. For example, process variations may be overcome by running a slower device at an increased voltage and running a faster device at a decreased voltage. However, this approach is too cumbersome, and thus ineffective, since the supply voltage provided to each semiconductor die would have to be individually adjusted. Additionally, this approach undesirably hinders semiconductor die interchangeability in different hardware platforms.

Thus, there is a need in the art for a semiconductor die that is effectively compensated for process variations such that each semiconductor die meets customer required specifications.

SUMMARY OF THE INVENTION

The present invention is directed to a semiconductor die with process variation compensated operating voltage. The invention addresses and resolves the need in the art for a semiconductor die that is effectively compensated for process variations such that the semiconductor die meets customer required specifications.

According to an exemplary embodiment, a semiconductor die includes at least one process monitoring circuit for evaluating at least one process parameter of the semiconductor die. For example, the at least one process monitoring circuit may include a ring oscillator or a delay circuit. The at least one process monitoring circuit can include a first group of process monitoring circuits and a second group of process monitoring circuits, where the first group of process monitoring circuits monitors NFET speed and the second group of process monitoring circuits monitors PFET speed. The process monitoring circuits can be distributed at each corner of the semiconductor die.

According to this exemplary embodiment, the semiconductor die further includes a voltage control circuit configured to store optimum voltage information corresponding to the at least one process parameter. The voltage control circuit is further configured to selectively provide the optimum voltage information to a system power supply. The voltage control circuit includes a calculated optimum voltage register, where the calculated optimum voltage register stores the optimum voltage information corresponding to the at least one process parameter. For example, the calculated optimum voltage register can be a fuse block or non-volatile memory, such as an EPROM, an EEPROM, or a PROM.

According to this exemplary embodiment, the voltage control circuit can be further configured to selectively provide user programmed operating voltage information to the system power supply. The voltage control circuit can be further configured to selectively provide default operating voltage information to the system power supply, where the default operating voltage does not correspond to the at least one process parameter. Other features and advantages of the present invention will become more readily apparent to those of ordinary skill in the art after reviewing the following detailed description and accompanying drawings.

DETAILED DESCRIPTION OF THE INVENTION

The present invention is directed to a semiconductor die with process variation compensated operating voltage. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description merely exemplify various embodiments of the invention. To maintain brevity, other embodiments of the present invention are not specifically described in the present application and are not specifically illustrated by the present drawings.

Figure 1:
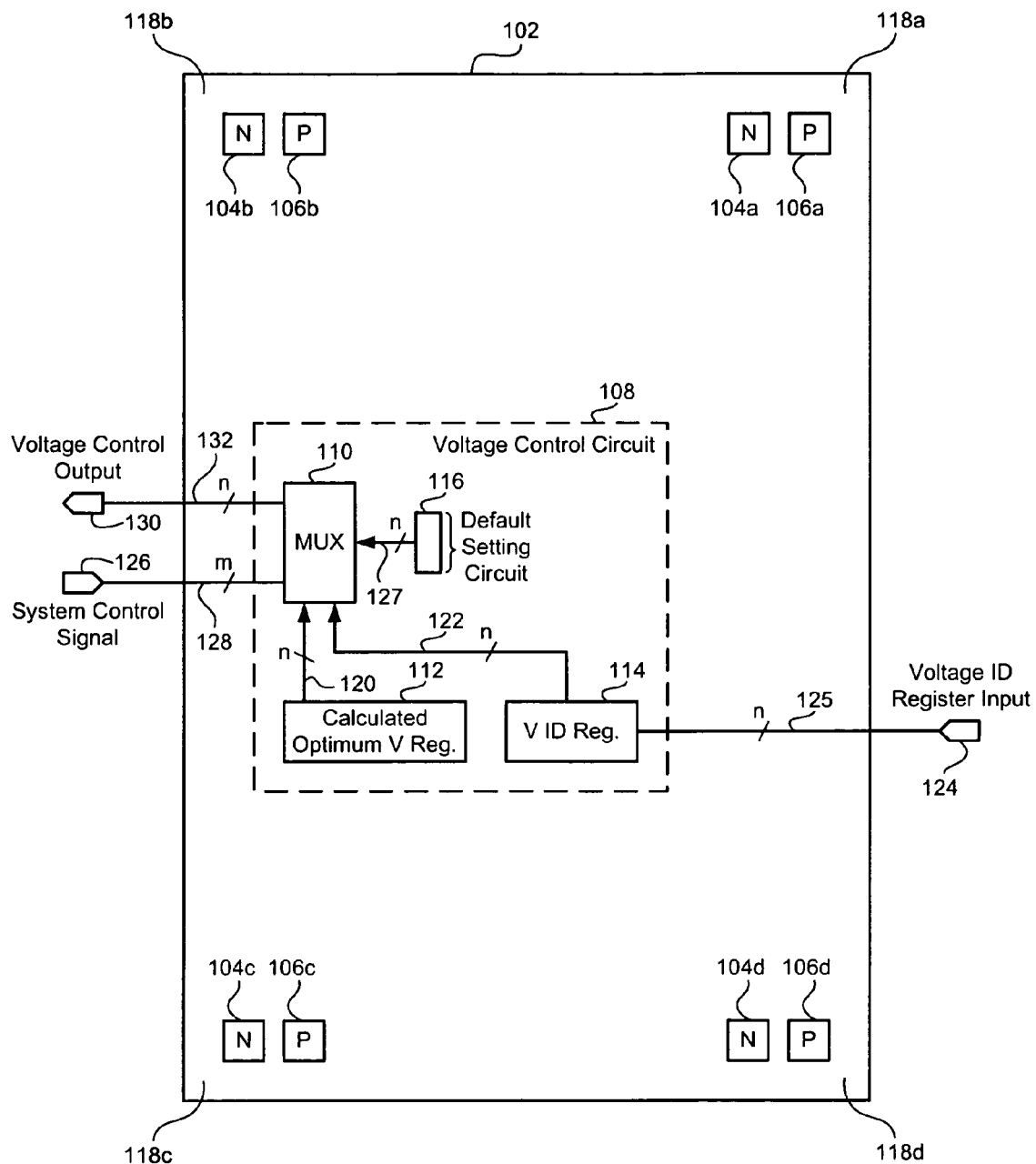
FIG. 1 is a block diagram of an exemplary voltage control circuit and exemplary process monitoring circuits in an exemplary semiconductor die in accordance with one embodiment of the present invention.

FIG. 1 shows a block diagram of an exemplary voltage control circuit and exemplary process monitoring circuits on an exemplary semiconductor die in accordance with one embodiment of the present invention. Certain details and features have been left out of FIG. 1, which are apparent to a person of ordinary skill in the art. Semiconductor die 102 includes process monitoring circuits 104*a*, 104*b*, 104*c*, and 104*d* (hereinafter "process monitoring circuits 104*a* through 104*d*"), process monitoring circuits 106*a*, 106*b*, 106*c*, and 106*d* (hereinafter "process monitoring circuits 106*a* through

106d''), and voltage control circuit 108. Voltage control circuit 108 includes multiplexer ("MUX") module 110, calculated optimum voltage register 112, voltage ID register 114, and default setting circuit 116. In the present embodiment, buses 120, 122, 125, 127, and 128 can be five-bit buses and bus 128 can be a two-bit bus. In other embodiments, buses 120, 122, 125, 127, and 128 can be n-bit buses, where "n" is less than or greater than five, and bus 128 can be an m-bit bus, where "m" is less than or greater than two.

Semiconductor die 102 further includes an internal voltage regulator (not shown in FIG. 1) which, upon power up, provides an initial operating voltage to activate process monitoring circuits 104a through 104d and 106a through 106d and voltage control circuit 108. However, the internal voltage regulator (not shown in FIG. 1) does not provide power to the core of semiconductor die 102. As will be discussed below, a core operating voltage for semiconductor die 102 is provided by an external power supply (not shown in FIG. 1), which can be controlled by voltage control circuit 108. The external power supply (not shown in FIG. 1) can be a system power supply, for example.

As shown in FIG. 1, in one embodiment of the invention, process monitoring circuits 104a through 104d are distributed in semiconductor die 102 at respective corners 118a, 118b, 118c, and 118d (hereinafter "corners 118a through 118d") of semiconductor die 102. Process monitoring circuits 104a through 104d are utilized to evaluate process parameters of semiconductor die 102. In the present embodiment, process monitoring circuits 104a through 104d can provide speed data regarding N-channel field effect transistors ("NFETs") in semiconductor die 102. In one implementation, process monitoring circuits 104a through 104d each utilize a ring oscillator fabricated with NAND gates for evaluating speed of NFETs in semiconductor die 102. Process monitoring circuits 104a through 104d can also comprise respective counters for generating and storing NFET speed data.

In another embodiment, process monitoring circuits 104a through 104d might each comprise a delay circuit for evaluating NFET speed and a counter for generating and storing NFET speed data. Each delay circuit can comprise a series of NAND gates, which can be used to measure NFET speed. Thus, process monitoring circuits 104a through 104d can monitor the effect of process variations on NFET speed at respective corners 118a through 118d of semiconductor die 102. In one embodiment, to obtain more reliable information about the die's process parameters, process monitoring circuits 104a through 104d are laid out with differing orientations. For example, process monitoring circuit 104b can be rotated 90.0 degrees with respect to process monitoring circuit 104a, process monitoring circuit 104c and be rotated 90.0 another degrees with respect to process monitoring circuit 104b, and process monitoring circuit 104d can be rotated an additional 90.0 degrees with respect to process monitoring circuit 104c. In other embodiments, process monitoring circuits 104a through 104d may have orientations that differ from one another by more or less than 90.0 degrees.

As also shown in FIG. 1, process monitoring circuits 106a through 106d are situated on semiconductor die 102 adjacent to process monitoring circuits 104a through 104d at corners 118a through 118d, respectively, of semiconductor die 102. Process monitoring circuits 106a through 106d are also utilized to evaluate process parameters of semiconductor die 102. In the present embodiment, process monitoring circuits 106a through 106d can provide speed data regarding P-channel field effect transistors ("PFETs") in semiconductor die 102. Process monitoring circuits 106a through 106d can each comprise a ring oscillator for monitoring PFET speed at a respective corner of semiconductor 102. Each PFET speed monitoring ring oscillator can comprise NOR gates, for example. Each of process monitoring circuits 106a through 106d can also comprise a counter for generating and storing respective PFET speed data.

In another embodiment, process monitoring circuits 106a through 106d can each comprise a delay circuit for monitoring PFET speed and a counter for generating and storing PFET speed data. Each PFET speed monitoring delay line can comprise a series of NOR gates, which can be used to determine PFET speed. Thus, process monitoring circuits 106a through 106d can monitor the effect of PFET speed at respective corners 118a through 118d of semiconductor die 102. In one embodiment, to obtain more reliable information about the die's process parameters, process monitoring circuits 106a through 106d are laid out with differing orientations. For example, process monitoring circuit 106b can be rotated 90.0 degrees with respect to process monitoring circuit 106a, process monitoring circuit 106c and be rotated another 90.0 degrees with respect to process monitoring circuit 106b, and process monitoring circuit 106d can be rotated still another 90.0 degrees with respect to process monitoring circuit 106c. In other embodiments, process monitoring circuits 106a through 106d may have orientations that differ from one another by more or less than 90.0 degrees.

Further shown in FIG. 1, calculated optimum voltage register 112 is coupled to an input of MUX module 110 by bus 120. Calculated optimum voltage register 112 can be configured to receive and store an n-bit binary number corresponding to an optimum operating voltage for semiconductor die 102 (also referred to as "optimum voltage information" in this application), and provide the n-bit number to an input of MUX module 110 on bus 120. The optimum operating voltage for semiconductor die 102 can be determined by analyzing speed data provided by process monitoring circuits 104a through 104d and 106a through 106d. By analyzing speed data provided by process monitoring circuits 104a through 104d and 106a through 106d to determine the optimum operating voltage, the present invention determines an optimum operating voltage that optimizes power and performance of semiconductor die 102 by compensating for process variations. The process variations can occur from lot to lot, wafer to wafer in the same lot, and even across the same wafer. Thus, the optimum operating voltage causes semiconductor die 102 to meet required power and performance specifications.

In the present embodiment, the n-bit binary number corresponding to the optimum operating voltage for semiconductor die 102 can be a five-bit binary number (i.e. "n" can be equal to five). In other embodiments, the n-bit binary number corresponding to the optimum operating voltage for semiconductor die 102 may have less than five bits or more than five bits. In the present embodiment, calculated optimum voltage register 112 can comprise a fuse block. In other embodiments, calculated optimum voltage register 112 may comprise non-volatile memory, such as programmable read-only memory ("PROM"), erasable-programmable-read-only memory ("EPROM"), electrically-erasable-programmable-read-only-memory ("EEPROM"), or other appropriate non-volatile memory.

Also shown in FIG. 1, voltage ID register 114 is coupled to an input of MUX module 110 via bus 122. Voltage ID register 114 can be configured to receive an n-bit binary number corresponding to an externally programmed operating voltage (also referred to as "user programmed operating voltage information" in this application) for semiconductor die 102 from programmable input 124 via bus 125, store the n-bit binary number, and provide the n-bit binary number to an input of MUX module 110 on bus 122. Voltage ID register input 124 allows an n-bit binary number corresponding to a desired operating voltage for semiconductor die 102 to be externally programmed into voltage ID register 114. Voltage ID register 114 can comprise a block of data registers, for example.

Further shown in FIG. 1, default setting circuit 116 is coupled to an input of MUX module 110 via bus 127. Default setting circuit 116 can be configured to store an n-bit binary number corresponding to a default operating voltage (also referred to as "default operating voltage information" in this application) and output the n-bit binary number to an input of MUX module 110 on bus 127. The default operating voltage is a nominal operating voltage that is not compensated for process variations and is determined for semiconductor die 102 without considering process variations that can affect the semiconductor die performance.

As shown in FIG. 1, MUX module 110 is coupled to calculated optimum voltage register 112, voltage ID register 114, and default setting circuit 116 via buses 120, 122, and 127, respectively. MUX module 110 can be configured to receive system control signal 126 on bus 128 and respective outputs of calculated optimum voltage register 112, voltage ID register 114, and default setting circuit 116 on respective buses 120, 122, and 127, and provide voltage control output 130 (also referred to as an output of voltage control circuit 108) on bus 132. System control signal 126 determines which one of respective outputs of calculated optimum voltage register 112, voltage ID register 114, and default setting circuit 116 is provided at voltage control output 130. In the present embodiment, system control signal 126 comprises a two-bit binary number. In other embodiments, system control signal 126 may comprise an m-bit binary number, where "m" is less than two or greater than two.

Voltage control output 130 of voltage control circuit 108 is coupled to an external power supply (not shown in FIG. 1), which power supply provides a core operating voltage to semiconductor die 102 that is determined by the particular n-bit binary number that controls the external power supply (also referred to as the "system power supply" in this application) by voltage control circuit 108. Thus, the core operating voltage provided to semiconductor die 102 by the external power supply will be an optimum operating voltage, an externally programmed operating voltage, or a default operating voltage, depending on whether the respective output of calculated optimum voltage register 112, voltage ID register 114, or default setting circuit 116 is selected by system control signal 126. As such, by selectively providing the output of calculated optimum voltage register 112 to the external power supply, the external power supply provides an optimum operating voltage to semiconductor die 102, which advantageously optimizes the power and performance of semiconductor die 102.

Figure 2:
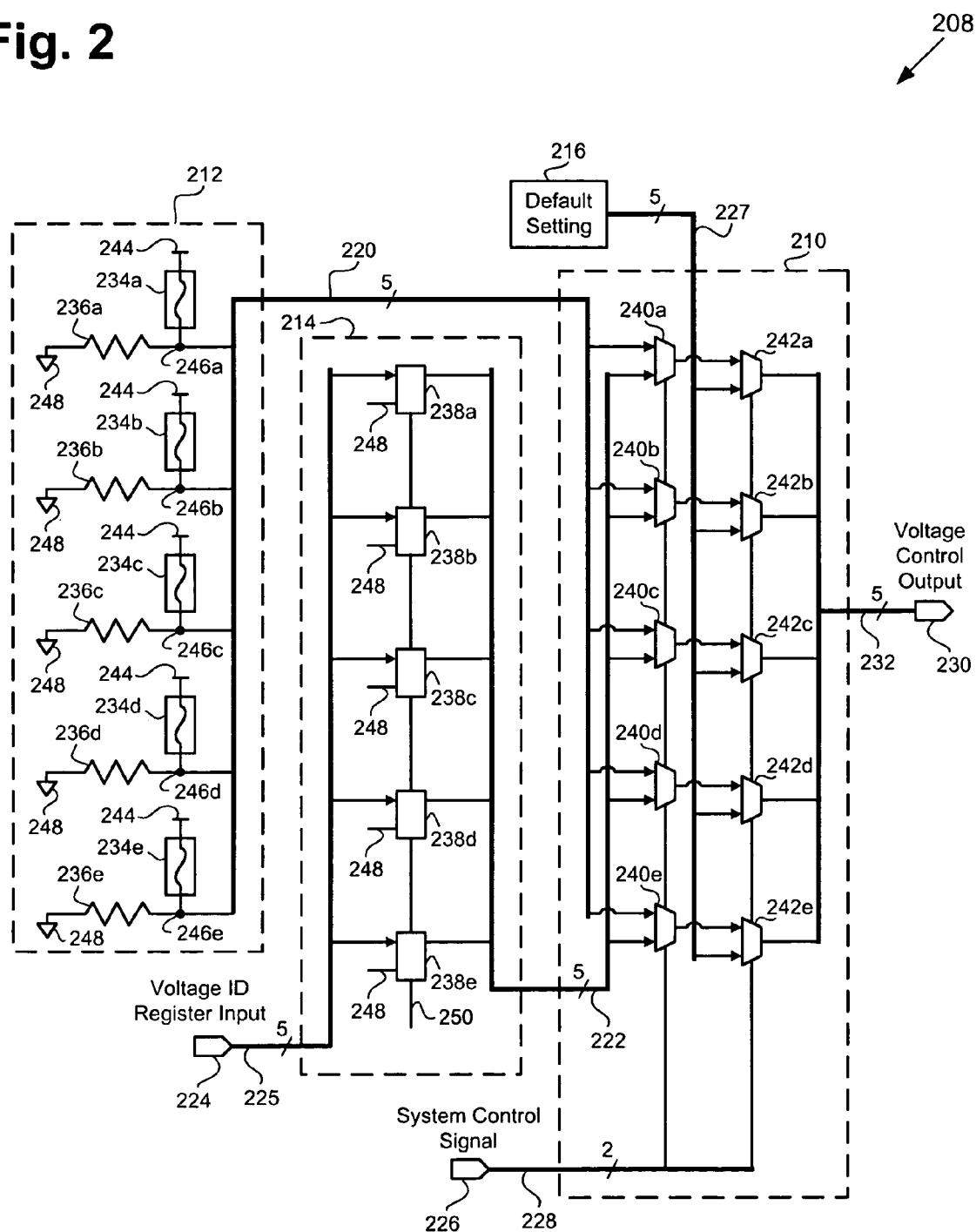
FIG. 2 illustrates a circuit diagram of an exemplary voltage control circuit in accordance with one embodiment of the present invention.

FIG. 2 shows a circuit diagram of a voltage control circuit in accordance with one embodiment of the present invention. Voltage control circuit 208 in FIG. 2 corresponds to voltage control circuit 108 in FIG. 1. In particular, MUX module 210, calculated optimum voltage register 212, voltage ID register 214, default setting circuit 216, voltage ID register input 224, system control signal 226, voltage control output 230, and buses 220, 222, 225, 227, 228, and 230 in FIG. 2 correspond, respectively, to MUX module 110, calculated optimum voltage register 112, voltage ID register 114, default setting circuit 116, voltage ID register input 124, system control signal 126, voltage control output 130, and buses 120, 122, 125, 127, 128, and 130 in FIG. 1. Calculated optimum voltage register 212 includes fuses 234a, 234b, 234c, 234d, and 234e (hereinafter "fuses 234a through 234e") and resistors 236a, 236b, 236c, 236d, and 236e (hereinafter "resistors 236a through 236e"), voltage ID register 214 includes registers 238a, 238b, 238c, 238d, and 238e (hereinafter "registers 238a through 238e), and MUX module 210 includes MUXs 240a, 240b, 240c, 240d, and 240e (hereinafter "MUXs 240a through 240e") and MUXs 242a, 242b, 242c, 242d, and 242e (hereinafter "MUXs 242a through 242e").

As shown in FIG. 2, fuses 234a through 234e are coupled between supply voltage 244 and respective nodes 246a, 246b, 246c, 246d, and 246e (hereinafter "nodes 246a through 246e") and resistors 236a through 236e are coupled between ground 248 and respective nodes 246a through 246e. The value of resistors 236a through 236e can be selected such that a zero ("0") bit is defined at nodes 246a through 246e when respective fuses 234a through 234e are opened (i.e. blown) and a one ("1") bit is defined at nodes 246a through 246e when respective fuses 234a through 234e are closed (i.e. not blown). Thus, by appropriate blowing or not blowing each of fuses 234a through 234e, a desired five-bit binary number can be programmed and stored at nodes 246a through 246e in calculated optimum voltage register 212. The five-bit binary number that is stored at nodes 246a through 246e is coupled to MUX module 210 via bus 220. In the present embodiment, the five-bit binary number that is stored at nodes 246a through 246e corresponds to an optimum operating voltage for semiconductor die 102 in FIG. 1, which is determined by analyzing the speed performance data provided by process monitoring circuits 104a through 104d and 106a through 106d in FIG. 1.

As also shown in FIG. 2, voltage ID register input 224 is coupled to respective inputs of registers 238a through 238e of voltage ID register 214 via bus 225. In the present embodiment, voltage ID register input 224 can be utilized to program a five-bit binary number corresponding to a desired operating voltage for semiconductor die 102 in FIG. 1 in registers 238a through 238e. The five-bit binary number can be outputted to MUX module 210 via bus 222. As further shown in FIG. 2, clock 248 and reset 250 are coupled to registers 238a through 238e. As also shown in FIG. 2, respective first inputs of MUXs 240a through 240e in MUX module 210 receive outputs from nodes 246a through 246e in calculated optimum voltage register 212 via bus 220 and respective second inputs of MUXs 240a through 240e receive outputs from registers 238a through 238e in voltage ID register 214 via bus 222. MUXs 240a through 240e are coupled to system control signal 226 via bus 228 and the outputs of MUXs 240a through 240e are coupled to respective first inputs of MUXs 242a through 242e.

As further shown in FIG. 2, an output of default setting circuit 216, which corresponds to a default operating voltage for semiconductor die 102, is coupled to respective second inputs of MUXs 242a through 242e via bus 227. MUXs 242a through 242e are coupled to system control signal 226 via bus 228 and the outputs of MUXs 242a through 242e are coupled to voltage control output 230 via bus 232. System control signal 226 controls MUXs 240a through 240e and MUXs 242a through 242a such that the output of calculated optimum voltage register 212 is provide at voltage control output 230 in an optimum mode, the output of voltage ID register 214 is provide at voltage control output 230 in an external mode, and the output of default setting circuit 216 is provided at voltage control output 230 in a default mode. In one embodiment, MUXs 240a through 240e may be combined with respective MUXs 242a through 242e.

The operation of the invention's voltage control circuit and process monitoring circuits will now be discussed with reference to FIG. 1. Voltage control circuit 108 is coupled to an external power supply (not shown in FIG. 1) and controls a core operating voltage that the external power supply provides to semiconductor die 102 by appropriately programming the external power supply. Voltage control circuit 108 is controlled by system control signal 126, which determines whether voltage control circuit 108 operates in an optimum mode, an external mode, or a default mode.

In the optimum mode, system control signal 126 causes MUX module 110 to selectively output an n-bit binary number corresponding to an optimum operating voltage, which is stored in calculated optimum voltage register 112. The optimum operating voltage can be determined by evaluating process parameter data provided by process monitoring circuits 104a through 104d, such as NFET speed, and process parameter data provided by process monitoring circuits 106a through 106d, such as PFET speed. By utilizing process monitoring circuits 104a through 104d and 106a through 106d, and further by distributing the process monitoring circuits at respective corners 118a through 118d of the die, process parameters can be determined for each individual die, and an optimum operating voltage can be determined that provides optimized power and performance for each individual die.

In the optimum mode, optimum voltage information corresponding to the optimum operating voltage for semiconductor die is provided to the external power supply. The optimum voltage information causes the external power supply to provide an optimum operating voltage to semiconductor die 102. Thus, when the optimum mode is selected by system control signal 126, the optimum operating voltage is automatically provided to semiconductor die 102 by the external power supply (not shown in FIG. 1).

In the external mode, system control signal 126 causes MUX module 110 to output externally programmed operating voltage information, which is stored in voltage ID register 114. The externally programmed operating voltage, which may be a user programmed operating voltage, may be programmed into voltage ID register 114 via voltage ID register input 124. The externally programmed operating voltage information, which is provided to the external power supply in the external mode, causes the external power supply to provide the externally programmed operating voltage to semiconductor die 102. Voltage ID register input 124, which is coupled to voltage ID register 114, advantageously allows a user to program voltage ID register 114 to provide an appropriate operating voltage to semiconductor die 102 that optimizes the power and performance of semiconductor die 102 for a specific task or for a specified duration.

In the default mode, system control signal 126 causes MUX module 110 to output default operating voltage information, which is stored in default setting circuit 116. The default operating voltage is a nominal operating voltage 102 which is determined for semiconductor die 102 without considering process variations that may affect the die (i.e. semiconductor die 102). The default operating voltage information, which is provided to the external power supply, causes the external power supply to provide the default operating voltage to semiconductor die 102.

Thus, as discussed above, the present invention evaluates process parameter data of a semiconductor die provided by the process monitoring circuits to advantageously determine an optimum operating voltage for the semiconductor die. The optimum operating voltage, which is automatically provided to the semiconductor die when an external power supply is appropriately controlled by the invention's voltage control circuit, advantageously optimizes the power and performance of the semiconductor die. The optimum operating voltage also advantageously allows the semiconductor die to meet required power and performance specifications. Thus, the optimum operating voltage advantageously increases semiconductor die yield by reducing the number of semiconductor dies that must be discarded for being out of specification.

Additionally, the present invention's voltage control circuit can operate in an external mode to advantageously provide an externally programmed operating voltage to the semiconductor die. The externally programmed operating voltage can be programmed by a user to provide a core operating voltage that advantageously optimizes the power and performance of semiconductor die for a specific task or for a specified duration.

From the above description of the invention it is manifest that various techniques can be used for implementing the concepts of the present invention without departing from its scope. For example, the invention has been described primarily in relation to evaluating NFET and/or PFET speed—which is indicative of one or more process parameters of the die. However, it is understood that various process parameters underlying the speed data, such as channel length, threshold voltage, oxide thickness, diffusion region doping level, and other relevant process parameters can be evaluated according to various embodiments of the invention, without departing from the general concept of the invention as disclosed herein. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a semiconductor die with process variation compensated operating voltage has been described.

The invention claimed is:

1. A semiconductor die comprising:
    at least one process monitoring circuit for evaluating at least one process parameter of said semiconductor die;
    a voltage control circuit configured to store optimum voltage information corresponding to said at least one process parameter;
    said voltage control circuit further configured to selectively provide said optimum voltage information to a system power supply;
    wherein said voltage control circuit is further configured to selectively provide user programmed operating voltage information to said system power supply.

2. The semiconductor die of claim 1 wherein said voltage control circuit comprises a calculated optimum voltage register, wherein said calculated optimum voltage register stores said optimum voltage information corresponding to said at least one process parameter.

3. The semiconductor die of claim 2 wherein said calculated optimum voltage register comprises a fuse block.

4. The semiconductor die of claim 2 wherein said calculated optimum voltage register comprises non-volatile memory, wherein said non-volatile memory is selected from the group consisting of an EPROM, an EEPROM, and a PROM.

5. The semiconductor die of claim 1 wherein said at least one process monitoring circuit comprises a first plurality of process monitoring circuits for evaluating NFET speed and a second plurality of process monitoring circuits for evaluating PFET speed.

6. The semiconductor die of claim 1 wherein said at least one process monitoring circuit comprises a ring oscillator.

7. The semiconductor die of claim 1 wherein said at least one process monitoring circuit comprises a delay circuit.

8. The semiconductor die of claim 5 wherein said first plurality of process monitoring circuits and said second plurality of process monitoring circuits are distributed at corners of said semiconductor die.

9. A system including a semiconductor die and an external power supply, said system comprising:
   at least one process monitoring circuit in said semiconductor die for evaluating at least one process parameter of said semiconductor die;
   a voltage control circuit in said semiconductor die, said voltage control circuit being configured to store optimum voltage information corresponding to said at least one process parameter, said voltage control circuit being coupled to said external power supply;
   said voltage control circuit being further configured to selectively provide said optimum voltage information to said external power supply, said external power supply providing an optimum operating voltage to said semiconductor die in response to said optimum voltage information;
   wherein said voltage control circuit is further configured to selectively provide user programmed operating voltage information to said external power supply.

10. The system of claim 9 wherein said voltage control circuit comprises a calculated optimum voltage register, wherein said calculated optimum voltage register stores said optimum voltage information corresponding to said at least one process parameter.

11. The system of claim 10 wherein said calculated optimum voltage register comprises a fuse block.

12. The system of claim 10 wherein said calculated optimum voltage register comprises non-volatile memory, wherein said non-volatile memory is selected from the group consisting of an EPROM, an EEPROM, and a PROM.

13. The system of claim 9 wherein said external power supply provides an optimum operating voltage to said semiconductor die when said voltage control circuit provides said optimum voltage information to said external power supply.

14. The system of claim 9 wherein said at least one process monitoring circuit comprises a first plurality of process monitoring circuits for evaluating NFET speed and a second plurality of process monitoring circuits for evaluating PFET speed.

15. The system of claim 9 wherein said at least one process monitoring circuit comprises a first plurality of process monitoring circuits for evaluating an NFET process parameter and a second plurality of process monitoring circuits for evaluating a PFET process parameter.

16. The system of claim 9 wherein said at least one process monitoring circuit comprises a plurality of process monitoring circuits for evaluating an NFET process parameter selected from the group consisting of a threshold voltage, a diffusion region doping level, an oxide thickness, and a channel length.

17. The system of claim 9 wherein said at least one process monitoring circuit comprises a plurality of process monitoring circuits for evaluating an PFET process parameter selected from the group consisting of a threshold voltage, a diffusion region doping level, an oxide thickness, and a channel length.

18. The system of claim 9 wherein said at least one process monitoring circuit comprises a first plurality of process monitoring circuits for evaluating NFET threshold voltage and a second plurality of process monitoring circuits for evaluating PFET threshold voltage.

19. The system of claim 9 wherein said at least one process monitoring circuit comprises a ring oscillator.

20. The system of claim 14 wherein said first plurality of process monitoring circuits and said second plurality of process monitoring circuits are distributed at corners of said semiconductor die.

21. A semiconductor die comprising:
   at least one process monitoring circuit for evaluating at least one process parameter of said semiconductor die;
   a voltage control circuit configured to store optimum voltage information corresponding to said at least one process parameter;
   said voltage control circuit further configured to selectively provide said optimum voltage information to a system power supply;
   wherein said voltage control circuit is further configured to selectively provide a default operating voltage information to said system power supply.

22. A system including a semiconductor die and an external power supply, said system comprising:
   at least one process monitoring circuit in said semiconductor die for evaluating at least one process parameter of said semiconductor die;
   a voltage control circuit in said semiconductor die, said voltage control circuit being configured to store optimum voltage information corresponding to said at least one process parameter, said voltage control circuit being coupled to said external power supply;
   said voltage control circuit being further configured to selectively provide said optimum voltage information to said external power supply, said external power supply providing an optimum operating voltage to said semiconductor die in response to said optimum voltage information;
   wherein said voltage control circuit is further configured to selectively provide a default operating voltage information to said external power supply.

* * * * *